United States Patent [19]

Neumann et al.

[11] Patent Number: 4,894,313
[45] Date of Patent: Jan. 16, 1990

[54] PHOTOSENSITIVE RECORDING ELEMENT COMPRISING MIGRATION RESISTANT DYES

[75] Inventors: Peter Neumann, Wiesloch; Guenter Wallbillich, Neustadt, both of Fed. Rep. of Germany

[73] Assignee: BASF Aktiengesellschaft, Ludwigshafen, Fed. Rep. of Germany

[21] Appl. No.: 48,751

[22] Filed: May 12, 1987

[30] Foreign Application Priority Data

May 31, 1986 [DE] Fed. Rep. of Germany ....... 3618373

[51] Int. Cl.$^4$ .................. G03C 1/495; G03C 1/68; G03C 1/70; G03C 1/76
[52] U.S. Cl. .................. 430/271; 430/270; 430/281; 430/512; 430/517; 430/519
[58] Field of Search ............... 430/271, 517, 519, 512, 430/281, 270

[56] References Cited

U.S. PATENT DOCUMENTS

| | | | |
|---|---|---|---|
| 2,791,504 | 5/1957 | Plambeck | 430/281 |
| 3,743,531 | 7/1973 | Ducharme | 430/281 |
| 3,782,951 | 1/1974 | Lee | 430/281 X |
| 3,854,950 | 12/1974 | Held | 430/11 |
| 3,888,672 | 6/1975 | Lee | 430/256 |
| 3,909,441 | 9/1975 | Ohyama et al. | 430/512 X |
| 4,053,313 | 10/1977 | Fan | 430/293 X |
| 4,126,466 | 11/1978 | Roos | 96/84 UV |
| 4,173,673 | 11/1979 | Bratt et al. | 430/306 X |
| 4,266,007 | 5/1981 | Hughes et al. | 430/281 X |
| 4,337,308 | 6/1982 | Franke | 430/306 |
| 4,356,251 | 10/1982 | Cohen et al. | 430/281 X |
| 4,370,405 | 1/1983 | O'Toole et al. | 430/312 |

FOREIGN PATENT DOCUMENTS

| | | |
|---|---|---|
| 407282 | 4/1966 | Australia . |
| 2202360 | 5/1971 | Fed. Rep. of Germany . |
| 2658422 | 12/1976 | Fed. Rep. of Germany . |
| 1001831 | 8/1965 | United Kingdom . |
| 1239732 | 7/1971 | United Kingdom ............... 430/512 |

OTHER PUBLICATIONS

"Micrelectronic Engineering", 1985—Elsevier Science Publishers B.V. (North Holland).

Primary Examiner—Paul R. Michl
Assistant Examiner—Cynthia Hamilton
Attorney, Agent, or Firm—Keil & Weinkauf

[57] ABSTRACT

Photosensitive recording elements which possess a photosensitive recording layer which is applied to a dimensionally stable base, if necessary via one or more intermediate layers, and have good photochemical properties and a long shelf life contain a compound of the general formula (I)

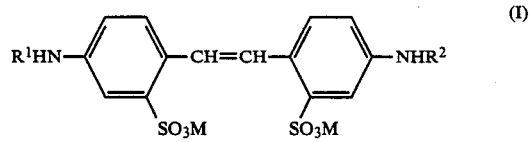

where M is a hydrogen atom or proton, an alkali metal cation, the ammonium cation or an amine cation and $R^1$ and $R^2$ are identical or different and are each a substituted s-triazine ring, in the photosensitive recording layer and/or any intermediate layer present, in order to control the photochemical properties.

4 Claims, No Drawings

PHOTOSENSITIVE RECORDING ELEMENT COMPRISING MIGRATION RESISTANT DYES

The present invention relates to a photosensitive recording element, in particular for the production of printing plates, relief plates or resist images, having a dimensionally stable base, a solid photosensitive recording layer applied on this and, if required, one or more intermediate layers between the and the photo-sensitive recording layer, and containing a light-absorbing, unreactive compound in the photosensitive recording layer or, where one or more intermediate layers are present between the base and the photosensitive recording layer, in the photosensitive recording layer and/or one or more of the intermediate layers.

Photosensitive recording elements of the stated type are used in reproduction technology, for example for the production of printing or relief plates and resist images. Conventionally used dimensionally stable bases are plastic films or sheets and steel or aluminum sheets; for photosensitive resist layers, other substrates, e.g. copper, copper-plated base elements, circuit boards, semiconductor elements and the like, are also suitable bases. The single-stratum or multi-stratum photosensitive layer may be formed from a photochemically degradable material, with the result that, when exposed to actinic light, it becomes soluble in solvents in which it was previously insoluble; it may also consist of a photopolymerizable mixture in which, on exposure to actinic light, photoinitiated polymerization and crosslinking results in a differentiation between the properties of unexposed areas and those of exposed areas, this differentiation being utilized for the development of the printing or relief plate or of the resist image. Frequently, and particularly when they are used for the production of printing or relief plates, the photosensitive recording elements contain, between the base and the photosensitive recording layer, one or more intermediate layers which are in the form of, for example, adhesion-promoting layers and/or antihalation layers and furthermore may be photosensitive or nonphotosensitive.

To control the photochemical processes during image production, for example to achieve a certain, desired relief structure, the known photosensitive recording elements as a rule contain, in the photosensitive recording layer and/or, where they are present, in one or more of the intermediate layers, dyes or pigments which absorb in the wavelength range of actinic light for the photosensitive recording layer (cf. inter alia US-A-2 791 504, GB-A-1 001 831, DE-A-26 58 422, DE-A-22 02 360 and US-A-4 173 673). Pigments have the disadvantage that they frequently cause undesirable light scattering and in some cases are difficult to mix in to give a homogeneous, uniform distribution in the relevant layer. It is for this reason that dyes are frequently used for controlling the exposure properties and other photochemical properties of the photosensitive recording elements. However, we have found that many of the dyes which are suitable per se and have furthermore been described for this purpose are not resistant to migration; i.e. if such dyes are present in the various layers of the photosensitive recording elements in graduated concentrations, the dyes migrate according to the concentration gradient to compensate the different concentrations and thus, as a rule, a change or loss of the selectively set photochemical properties of the photosensitive recording elements occurs. Although nonmigrating dyes for photosensitive recording elements have also been described, there are very few types and a very small number of dyes which actually possess the desired resistance to migration. Thus, there continues to be a demand for migration-resistant dyes for use in photosensitive recording elements for controlling the photochemical processes during exposure of these elements.

It is an object of the present invention to provide photosensitive recording elements of the type under discussion which have very good exposure and reproduction properties and a long shelf life and contain, in their photosensitive recording layer and/or any intermediate layer present between the dimensionally stable base and the said recording layer, a light-absorbing, unreactive compound for controlling the photochemical properties of these photosensitive recording elements, the said compound being present in the various layers of the photosensitive recording element in graduated concentrations without migration of the said compound and a consequent change in the photochemical properties and exposure properties of the photosensitive recording elements occuring, even during prolonged storage times.

We have found, surprisingly, that this object is achieved by photosensitive recording elements which contain, in their photosensitive recording layer and/or any intermediate layer present between the dimensionally stable base and the said recording layer, special, light-absorbing, unreactive compounds of the type defined below.

The present invention accordingly relates to a photosensitive recording element, in particular for the production of printing plates, relief plates or resist images, having (a) a dimensionally stable base,
(b) a solid photosensitive recording layer applied on the base with or without (c) one or more intermediate layers between the base and the photosensitive recording layer, and containing one or more light-absorbing, unreactive compounds in the photosensitive recording layer and/or, if one or more intermediate layers are present, in the photosensitive recording layers and/or one or more of the intermediate layers. In the novel photosensitive recording element, a compound of the general formula (I)

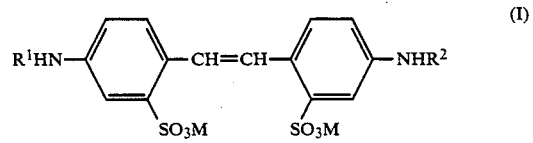

(I)

where M is a hydrogen atom or proton, an alkali metal and cation, the ammonium cation or an amine cation and $R^1$ and $R^2$ are identical or different and are each a substituted s-triazine ring, is present as the light-absorbing, unreactive compound.

For the purposes of the present invention, light-absorbing, unreactive compounds are those compounds which absorb in the wavelength range of light which is actinic for the photosensitive recording layer, i.e. have one or more strong absorption bands in the actinic wavelength range, without undergoing a photoinduced chemical reaction on exposure to actinic light. Although the light-absorbing, unreactive compounds of the general formula (I) which are to be used according to the invention in the photosensitive recording elements have their absorption maximum below 400 nm in the UV range and thus, as a rule, are not colored but, because of their fluorescence properties, tend to act as optical brighteners, for the purposes of this invention they will nevertheless be referred to below as dyes, for the sake of simplicity.

We have found, surprisingly, that the special light-absorbing compounds of the general formula (I) which are used according to the invention are extremely migration-resistant in the photosensitive recording elements and can be very advantageously used for establishing the photosensitivity and the exposure properties and for otherwise controlling the photochemical processes in the said recording elements when they are exposed to actinic light. The novel photosensitive recording elements are distinguished by a long shelf life, during which the desired and specifically set exposure and image reproduction properties are not adversely affected or changed. Because of the fluorescent effect of the dyes of the general formula (I) which are present according to the invention in the photosensitive recording elements, these dyes can particularly advantageously be used for setting, for example, the relief structure and sidewall shape during production of printing plates and relief plates. It was surprising that the fluorescent compounds of the general formula (I) are at all suitable as light-absorbing compounds for controlling the photochemical properties in photosensitive recording elements of the type under discussion.

A wide variety of methods can be used to establish specific exposure and image reproduction properties of the novel photosensitive recording elements or selectively to control the photochemical processes in the said elements during exposure to actinic light by means of the dyes of the general formula (I) which are to be used according to the invention.

For example, the said dyes can be present alone in the photosensitive recording layer of the photosensitive recording elements in a concentration gradient extending over the thickness of the said layer. The concentration of the said dyes can increase or decrease from the outer surface of the photosensitive recording layer toward the base. The photosensitive recording layer may consist of one stratum or of a plurality of strata having differentiated properties and different concentrations of the dyes of the general formula (I).

In photosensitive recording elements which contain an intermediate layer, for example an adhesionpromoting layer and/or an antihalation layer, between the dimensionally stable base and the photosensitive recording layer, the dye of the general formula (I) to be used according to the invention can be present alone in this intermediate layer or in graduated concentrations in both the photosensitive recording layer and the intermediate layer. In the last-mentioned case, the concentration of the said dye in the intermediate layer is as a rule higher than its concentration in the photosensitive recording layer. It is of course also possible for the exposure properties of the novel photosensitive recording elements or the photochemical processes in the said recording elements when they are exposed to actinic light to be controlled not only via the concentration but also via the type of dyes of the general formula (I), by incorporating, for example into the different layers of the said recording elements or the individual strata of a multistratum photosensitive recording layer, dyes of the type to be used according to the invention which have different absorption characteristics.

The dyes to be used according to the invention, which may be present in the photosensitive recording layer and/or any intermediate layer of the photosensitive recording elements which is present between the dimensionally stable base and the photosensitive recording layer, are compounds of the above general formula (I). In this formula, M is a hydrogen atom or proton, an alkali metal cation, in particular the lithium, sodium or potassium cation, the $NH_4+$ cation or an amine cation, in particular $H_2N^{\oplus}R^3R^4$ or $HN^{\oplus}R^3R^4R^5$, where $R^3$ and $R^4$ and $R^3, R^4$ and $R^5$, respectively, can be identical or different and are each alkyl, in particular of 1 to 4 carbon atoms, or hydroxyalkyl, in particular of 2 or 3 carbon atoms. M is preferably a hydrogen atom or proton.

$R^1$ and $R^2$ in the general formula (I) can be identical or different but as a rule are identical. They are each a substituted s-triazine ring. Examples of suitable substituents for the s-triazine radicals are $NH_2$, alkylamino, dialkylamino, hydroxyalkylamino, bis(hydroxyalkyl)amino, unsubstituted or substituted cycloalkylamino, morpholino, pyrrolidino, piperidino or unsubstituted or substituted piperazino, an arylamino group in which the aryl radical can be unsubstituted or substituted, alkoxyalkylamino, cyanoalkylamino, unsubstituted or substituted alkylarylamino, hydroxyl, unsubstituted or substituted alkoxy, unsubstituted or substituted aryloxy, unsubstituted or substituted alkylthio, unsubstituted or substituted arylthio and others. Preferred substituents for the s-triazine rings are unsubstituted or substituted amino, in particular $NH_2$, alkylamino or dialkylamino, in particular where alkyl is of 1 to 4 carbon atoms, (hydroxyalkyl)amino or di(hydroxyalkyl)amino, in particular where hydroxyalkyl is of 2 or 3 carbon atoms, or arylamino, in particular phenylamino or naphthylamino, the aryl radical being unsubstituted or substituted, in particular by alkyl, preferably alkyl of 1 to 4 carbon atoms and/or —$SO_3M$ (where M has the above meanings). The dyes of the general formula (I) in which each of the s-triazine rings of the radicals $R^1$ and $R^2$ is substituted by one substituted amino radical, preferably two substituted amino radicals, for example of the above type, have proven very advantageous for use according to the invention. Particularly preferred in this respect are the compounds of the general formula (I) in which $R^1$ and $R^2$ are each an s-triazine ring which is substituted by both a dialkylamino or di(hydroxyalkyl)amino group and an unsubstituted or substituted arylamino group. Among the arylamino substituents for the s-triazine rings, the phenylamino groups whose phenyl radical is substituted by one or more —$SO_3M$ radicals, where M has the above meanings and is, in particular, a hydrogen atom or proton, are of particular importance.

Examples of the dyes of the general formula (I) which are to be used according to the invention are the compounds of formulae (II) to (XVIII) below.

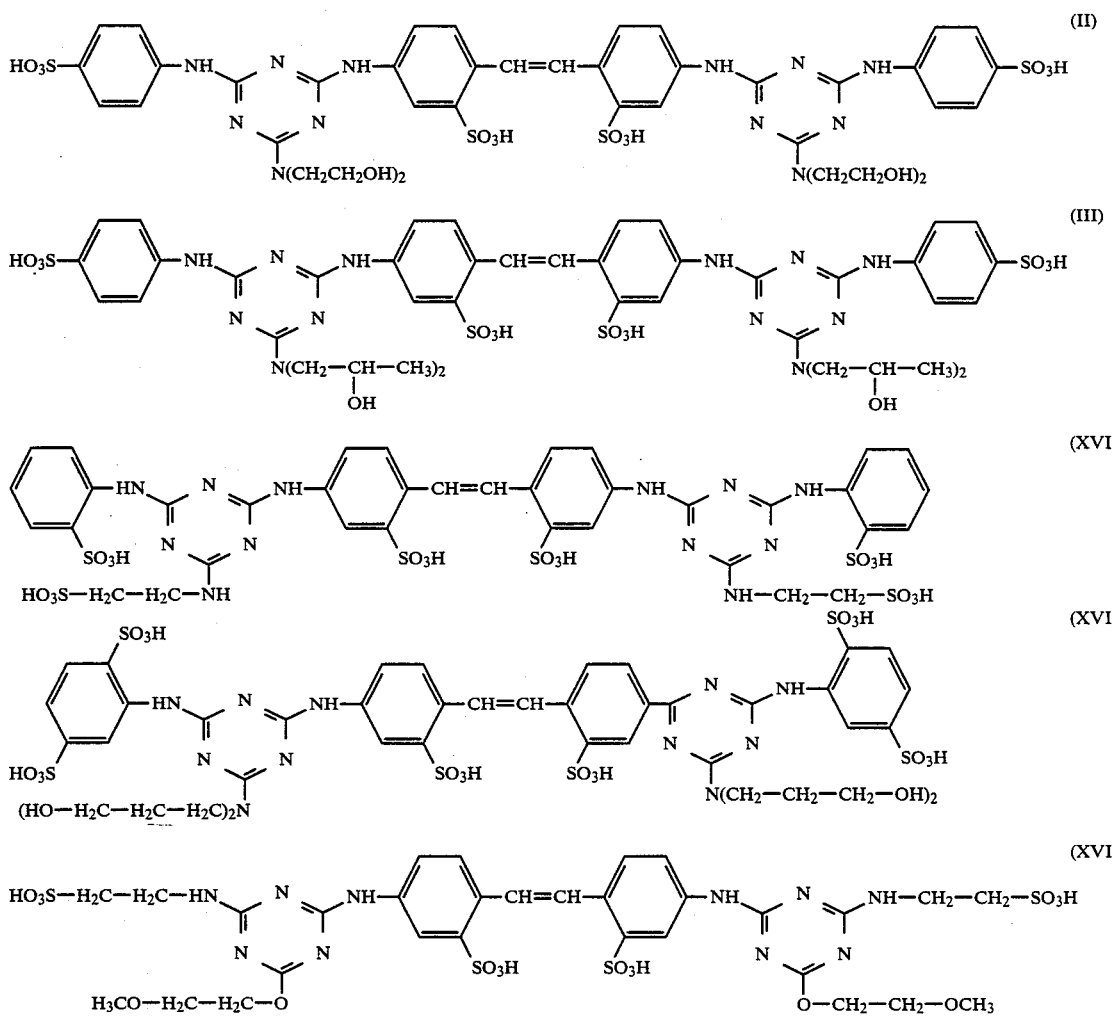

The dyes of the general formula (I) which are to be used according to the invention can be prepared according to the methods conventionally used for these compounds and known from the literature.

The said dyes are present in the photosensitive recording layer and/or any intermediate layers of the photosensitive recording elements in amounts effective for establishing the desired photochemical properties, as are known per se and conventionally used or can be readily determined by a few simple experiments. The concentration of the dyes of the general formula (I) in the stated layer or layers must be adapted to, inter alia, the intended use of the photosensitive recording elements (for example, in letter press, flexographic or gravure printing or as a photoresist), the thickness of the individual layers, the composition of the photosensitive recording elements (single-stratum or multi-stratum photosensitive recording layer, intermediate layers etc.) and the type and intensity of the light sources used when the photosensitive recording elements are employed, and accordingly can vary within wide limits.

Regarding the composition of the novel photosensitive recording elements, the following may be stated in addition.

Suitable bases are the dimensionally stable, rigid or, preferably, flexible bases which are known per se and conventionally used for photosensitive recording elements of the type under discussion, and whose choice depends on, inter alia, the intended use of the photosensitive recording elements. For example, printing or relief plates are produced using, in particular, plastic films or sheets, in particular of polyesters, e.g. polyethylene terephthalate, as well as metallic bases, for example steel or aluminum sheets, as dimensionally stable bases. In these cases, the photosensitive recording layer is firmly bonded to the dimensionally stable base. For this purpose, the bases may be pretreated in a conventional manner, for example mechanically, chemically, electrochemically and/or by providing them with an adhesion-promoting primer. For photoresist films and photosensitive film resist materials, preferably used bases are plastic films and sheets, in particular polyester films, for example films of polyethylene terephthalate, which exhibit moderate adhesion to the photosensitive recording layer and, after lamination of the said layer with a substrate, can be peeled off from this layer, before or after exposure to actinic light. In order to produce resist images, the photosensitive recording layer can also be applied directly to the substrate to be protected and, if required, to be permanently modified, this substrate then acting as a base for the photosensitive recording layer. Examples of suitable substrates for photosensitive resist layers are copper sheets, copperplated bases, ceramic substrates coated with metallic or metal oxide layers, semiconductor elements, silicon wafers and the like.

The photosensitive recording layer of the novel photosensitive recording elements can be positive-working or negative-working and can in principle consist of any materials conventionally used for such layers. For example, the known photochemically degradable materials or materials which, when exposed to actinic light, become soluble in solvents in which they were previously insoluble are suitable for the photosensitive recording layer. These include, for example, the positive-working recording materials based on compounds containing o-quinonediazide groups, as described, inter alia, in DE-A-20 28 903, DE-A-22 36 914, US-A-3 782 939, US-A-3 837 860 and US-A-4 193 797. These also include, in particular, the photosensitive recording materials which contain, as a photosensitive component, a compound having two or more aromatic and/or heteroaromatic o-nitrocarbinol ester groups, as described in, for example, DE-C-21 50 691, DE-B-23 09 062, DE-A-29 22 746, US-A-4 456 679, US-A-4 465 760, EP-A-101 586 or EP-A-141 389.

The photosensitive recording layer of the novel photosensitive recording elements is preferably formed from a photopolymerizable or photocrosslinkable mixture which contains, in addition to one or more photoinitiators, one or more ethylenically unsaturated, photopolymerizable or photocrosslinkable compounds; the latter can be monomers or oligomers, or polymers containing photopolymerizable or photocrosslinkable groups. The photopolymerizable mixture preferably contains only those ethylenically unsaturated, photopolymerizable compounds which possess two or more ethylenically unsaturated, photopolymerizable double bonds, or mixtures of these with ethylenically unsaturated, photopolymerizable compounds having only one ethylenically unsaturated, photopolymerizable double bond. The photopolymerizable or photocrosslinkable mixtures may furthermore contain other components, in particular polymeric binders which are compatible with the ethylenically unsaturated, photopolymerizable compounds, and thermal polymerization inhibitors, fillers, plasticizers, sensitometric regulators, dyes, photochromic compounds or systems and the like. Such photopolymerizable mixtures for photosensitive recording layers are sufficiently well known to the skilled worker and are described in the relevant technical literature.

Particularly advantageous are the photosensitive photopolymerizable recording layers which can be developed with aqueous developers, i.e. photosensitive recording layers which consist of a photopolymerizable mixture which is soluble or at least dispersible in the aqueous developers. These photopolymerizable mixtures contain one or more saturated polymeric binders and/or unsaturated, photopolymerizable or photocrosslinkable polymeric binders, as a rule one or more ethylenically unsaturated, photopolymerizable, low molecular weight compounds and one or more photopolymerization initiators, with or without further additives and/or assistants, for example thermal polymerization inhibitors, plasticizers, leveling agents, further dyes, fillers and the like. Examples of these are the photopolymerizable mixtures which can be washed out with water/alcohol developers and contain, as binders, one or more soluble nylons or nylon copolymers one or more compatible, ethylenically unsaturated, low molecular weight compounds having two or more photopolymerizable double bonds and one or more photoinitiators, with or without further additives and/or assistants of the stated type, as described in, for example, FR-A-15 20 856 or DE-A-22 02 357.

Particularly advantageous photosensitive recording elements are those which have a water-developable photosensitive recording layer consisting of a photopolymerizable mixture based on water-soluble or at least water-dispersible polymeric binders, as described in, for example, British Patent Nos. 834,337, 1,233,883, 1,351,475, 786,119, 814,227 and 835,849, U.S. Pat. Nos. 3,801,328, 3,877,939 and 4,272,611, DE-A-31 44 905, EP-A-70 510, EP-A-70 511 or EP-A-129 901. Examples of polymeric binders which may be present in these photopolymerizable mixtures are the known homo- or copolymers of N-vinylpyrrolidone which are soluble or at least dispersible in water, examples of comonomers being the vinyl esters, e.g. vinyl acetate. Hydrolyzed N-vinylpyrrolidone/vinyl ester copolymers are also suitable. Binders which have proven particularly advantageous for these photopolymerizable mixtures are vinyl alcohol polymers possessing —$CH_2CH(OH)$-structural units in the polymer main chain, and their copolymers and derivatives which are soluble or dispersible in water or aqueous solvents, e.g. esters, ethers or acetals. The known partially hydrolyzed polyvinyl esters of aliphatic monocarboxylic acids of 1 to 4 carbon atoms, such as polyvinyl acetates or polyvinyl propionates, whose mean degree of polymerization is about 200–3000 and whose degree of hydrolysis is about 65–98, in particular about 80–88, mol %, are particularly suitable. Mixtures of (partially) hydrolyzed vinyl ester polymers or copolymers having different degrees of polymerization and/or different degrees of hydrolysis can also be used. Other examples of polymers in this connection are the reaction products of vinyl alcohol polymers with acrylic anhydride and/or methacrylic anhydride, these reaction products generally containing, as copolymerized units, from 1 to 12 mol %, based on the reaction product, of acryloyl and/or methacryloyl groups, as well as the water-soluble reaction products of vinyl alcohol polymers with ethylene oxide, the amount of ethylene oxide units in the oxyethylated vinyl alcohol polymer being from 5 to 75, in particular from 10 to 60, % by weight. These reaction products of vinyl alcohol polymers may be present as the sole polymer component in the photopolymerizable mixtures or as a mixture with other compatible polymers, in particular the abovementioned partially hydrolyzed polyvinyl esters.

If the photopolymerizable mixtures contain polymers having ethylenically unsaturated photopolymerizable or photocrosslinkable groups, the addition of photopolymerizable, ethylenically unsaturated, low molecular weight compounds to the photopolymerizable mixtures is not absolutely essential but is frequently advantageous.

Particular examples of the photopolymerizable, ethylenically unsaturated, low molecular weight compounds are the oligomers and monomers containing acryloyl and/or methacryloyl groups, including mono-, di- and poly(meth)acrylates, as obtained by esterification of acrylic acid or methacrylic acid with monohydric or polyhydric low molecular weight alcohols, e.g. the di- and tri(meth)acrylates of ethylene glycol, diethylene glycol, triethylene glycol, polyethylene glycols having a molecular weight of up to about 500, propane-1,2-diol, propane-1,3-diol, polypropylene glycols having a molecular weight of up to about 500, 2,2-dimethylpropanediol, butane-1,4-diol, 1,1,1-trimethylolpropane, glycerol or pentaerythritol; the monoacrylates and monomethacrylates of such diols or polyols, e.g. ethylene glycol mono(meth)acrylate, propanediol mono(meth)acrylate and di-, tri- or tetraethylene glycol mono(meth)acrylate; the (meth)acrylates of monoalkanols of 1 to 8 carbon atoms, (meth)acrylamide and mono- and bis(meth)acrylamides of aliphatic or aromatic diamines of 2 to 8 carbon atoms, derivatives of the (meth)acrylamides, e.g. hydroxymethyl(meth)acrylamide or, in particular, the reaction product of 2 moles of N-hydroxy-methyl(meth)acrylamide and 1 mole of an aliphatic diol e.g. ethylene glycol or propylene glycol; and monomeric or oligomeric, urethane-containing acrylate or methacrylate compounds.

The choice of the photopolymerizable, ethylenically unsaturated compounds depends in a known manner on the polymers present in the photopolymerizable mixtures with which polymers they are intended to be compatible, and on the intended use of the photosensitive recording elements. This choice is familiar to the skilled worker and is described in, inter alia, the publications cited above. The photopolymerizable mixtures contain the polymers and the photopolymerizable, ethylenically unsaturated, low molecular weight compounds in general in an amount of about 40–90% by weight and 10–60% by weight, respectively, the percentages in each case being based on the sum of the polymer and the photopolymerizable, ethylenically unsaturated, low molecular weight compound. The amount of the said low molecular weight compounds may also be larger or smaller in specific cases. For example, it is possible to reduce the amount of the said low molecular weight compounds to below 10% by weight if the photopolymerizable mixture contains unsaturated polymers having a sufficiently high content of photopolymerizable or photocrosslinkable double bonds; it may also be above 60% by weight, for example if photopolymerizable oligomers are also present, provided that the photosensitive recording layer is solid at room temperature.

Suitable photopolymerization initiators, which are present in the photopllymerizable mixtures in general in an amount of from 0.05 to 10, in particular from 0.5 to 5, % by weight, based on the photopolymerizable mixture, are the conventional photopolymerization initiators which can be activated by actinic light in the wavelength range from 300 to 400 nm. Examples of these are benzoin, benzoin ethers, in particular benzoin alkyl ethers, substituted benzoins, alkyl ethers of substituted benzoins, eg. α-methylbenzoin alkyl ethers or α-hydroxymethylbenzoin alkyl ethers; benzil, benzil ketals, in particular benzil dimethyl ketal; the acylphosphine oxide compounds which are known, effective photoinitiators, e.g. 2,4,6trimethylbenzoyldiphenylphosphine oxide; benzophenone, derivatives of benzophenone, Michler's ketone, derivatives of Michler's ketone; anthraquinone and substituted anthraquinones, aryl-substituted imidazoles or their derivatives, e.g. 2,4,5-triarylimidazole dimers and the like. Because of the fluorescence properties of the dyes of the general formula (I) which are present according to the invention in the photosensitive recording elements, it is possible, and in many cases advantageous, if, in addition to the photoinitiators which can be activated by actinic light in the wavelength range from 300 to 400 nm, photoinitiators or photochemically reactive compounds which respond to the fluorescent light emitted by the dyes of the general formula (I) and are activated by this light are also used in the photosensitive recording layers. In the strata or regions of the photosensitive recording layer in which, on exposure of the photosensitive recording element to actinic light in the wavelength range from 300 to 400 nm, the fluorescent light emitted by the dyes of the general formula (I) is effective, an additional photochemical reaction can thus be produced and in particular the relief structure can be influenced as a result. If the said dyes are present in the photosensitive recording elements, for example in an intermediate layer between the base and the photosensitive recording layer and/or a stratum of the photosensitive recording layer which is adjacent to the base, it is possible, for example, by using the photoinitiators which respond to the fluorescent light, to obtain more firmly supported relief elements in the relief or printing plates produced using the photosensitive recording elements. Preferably, the photoinitiators or photochemically reactive compounds which respond to the fluorescent light are present in the photosensitive recording layer in the immediate vicinity of the base or of any intermediate layers, i.e. in the lower regions of the photosensitive recording layer with respect to the outer surface.

The photopolymerizable mixtures for the photosensitive recording layers may furthermore contain conventional additives and/or assistants of the above-mentioned type in the conventional, effective amounts. In particular, the types and amounts of the components of the said recording layer are matched up with one another in such a way that the said layer of the novel photosensitive recording elements is solid at room temperature.

Particularly when they are used for the production of printing or relief plates, the said recording elements can contain one or more intermediate layers between the dimensionally stable base and the photosensitive recording layer, the said intermediate layers being, in particular, in the form of adhesion-promoting layers and/or antihalation layers. These intermediate layers are in general polymeric layers which may be photosensitive or non-photosensitive. Adhesion-promoting layers generally contain a polymer which corresponds to the polymeric binder in the photosensitive recording layer or is at least similar to this. Examples of suitable adhesion-promoting intermediate layers are those based on polyurethanes, polyvinyl alcohols or polyvinyl alcohol derivatives, nylons, epoxy resins, melamine/formaldehyde resins and the like, as described in, inter alia, DE-A-15 97 515, US-A-3 877 939, EP-A-53 258, EP-A-53 260, EP-A-2 321, US-A-4 387 157, US-A-4 355 093 or US-A-4 357 414. These intermediate layers can contain, in addition to the polymers, polymerizable monomers, such as hydroxyalkyl (meth)acrylates or urethane (meth)acrylates, as well as a photoinitiator.

If the intermediate layers are in the form of an antihalation layer, in order to avoid excessive and undesirable reflection of the incident actinic light by the dimensionally stable base during imagewise exposure of the photosensitive recording layer, the said intermediate layers furthermore contain compounds which absorb light in the actinic wavelength range, in particular the dyes of the general formula (I) which are to be used according to the invention and, if required, also other migratation-resistant dyes and/or pigments, in particular those which have their absorption maxima in another wavelength range, e.g. above 400 nm.

Since the dyes of the general formula (I) which are present according to the invention in the photosensitive recording elements show little or no tendency to migrate and, as a result, the photochemical properties of the photosensitive recording elements containing these dyes of the general formula (I) do not change even on prolonged storage, according to the invention it is possible, and also particularly advantageous for controlling the exposure properties of the photosensitive recording elements or the photochemical processes in these, for the dyes of the general formula (I) which are present according to the invention in the photosensitive recording layer and/or any intermediate layers to be contained in graduated concentrations over the thickness of the recording element, i.e. from the outer surface of the said recording layer toward the base. Since the photochemical properties of the said recording elements can be controlled on the basis of various principles, the said dyes can accordingly be present in the photosensitive recording layer and/or any intermediate layers in different manners.

For example, it may on the one hand be desirable, during imagewise exposure of the photosensitive recording elements, for the intensity of the actinic light incident on the photosensitive recording layer from above to be restricted at various depths in the layer in a particular manner and consequently the processes triggered by the light to be attenuated to different extents depending on the depth of penetration. This has a substantial effect on, for example, the form and printing properties of a letter press or gravure printing plate. To achieve this aim, the said dyes can be present in the photosensitive recording layer in a concentration gradient, i.e. in concentrations graduated over the thickness of the recording layer. This may be effected, for example, by producing the photosensitive recording layer from two or more strata which contain the dye or dyes of the general formula (I) in different concentrations. The dye concentration may be 0 in one or more of these strata of the photosensitive recording layer, i.e. individual strata of a multistratum photosensitive recording layer need not contain any dye if a dye of the general formula (I) to be used according to the invention is present in one or more strata of the said recording layer. In general, the dye concentration in the individual strata of the multistratum photosensitive recording layer either decreases from the outer surface of the photosensitive recording layer toward the dimensionally stable base or, preferably, increases. The same principle can also be achieved with a single-stratum photosensitive recording layer if, in this layer, the said dyes are present in a concentration gradient which runs from the outer surface of the photosensitive recording layer to the dimensionally stable base.

In other cases, during imagewise exposure of the photosensitive recording elements, the intention is for the actinic light incident on the photosensitive recording layer to be attenuated as little as possible on passing through the said layer. Particularly where nontransparent dimensionally stable bases are used, however, it is also intended to prevent actinic light which is incident imagewise from being thrown back, by reflection and/or uncontrolled scattering at the base or in an intermediate layer, into regions of the photosensitive recording layer which are intended to remain unexposed. In the production of letterpress printing plates, reflection and scattering may manifest themselves in inadequate formation of the shadow well depths, often having a considerable adverse effect on the printing process. In these cases, the photosensitive recording layer does not contain any dye or only contains dyes in a low concentration, Which are then preferably uniformly distributed in the photosensitive recording layer, the dyes of the general formula (I) to be used according to the invention being located in the base area of the photosensitive recording layer. This is achieved in general and most simply by incorporating the said dyes in this case in an intermediate layer between the dimensionally stable base and the photosensitive recording layer, the said intermediate layer preferably being located directly adjacent to the photosensitive recording layer.

It is of course also possible for the said dyes to be contained both in the photosensitive recording layer and in one or more of any intermediate layers present, in particular in different concentrations in the individual layers, the concentration of the said dyes in the intermediate layer or layers generally being higher than that in the photosensitive recording layer. In this case, the dyes of the general formula (I) in the photosensitive recording layer can be both homogeneously distributed and present in graduated concentrations over the layer thickness. In photosensitive recording elements which possess a plurality of intermediate layers between the dimensionally stable base and the photosensitive recording layer, it is possible for the said dyes to be present in only one, a plurality or all of these intermediate layers. It has proven advantageous, but is in no way essential, for the said dyes to be present in that intermediate layer which is directly adjacent to the photosensitive recording layer, i.e. in contact with this layer. Moreover, the said dyes can of course be used to color the photosensitive recording elements using a very wide range of variations of the methods described above, and can also be used to achieve other principles of inhomogeneous or discontinuous coloration of the photosensitive recording layers and/or of any intermediate layers present.

In a particular embodiment of the invention, the photosensitive recording elements can contain, in addition to the dyes of the general formula (I), other migration-resistant dyes in the photosensitive recording layer and/or any intermediate layers present, in particular those dyes which have absorption maxima above 400 nm and thus supplement the absorption characteristics of the dyes of the general formula (I). Such migration-resistant dyes which may be present in the photosensitive recording elements in addition to the dyes of the general formula (I) to be used according to the invention include, in particular, sulfo-containing azo or azoxy dyes, for example those of the general formula (XIX)

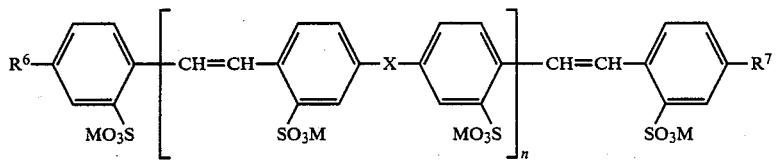

(XIX)

where X is an azo or azoxy group, M is a hydrogen atom or proton, an alkali metal cation, the ammonium cation or an amine cation, $R^6$ and $R^7$ are identical or different and independently of one another are each $-NO_2$, $NH_2$, $-NHCOR^8$ (where $R^8$ is hydrogen, unsubstituted or substituted alkyl, unsubstituted or substituted cycloalkyl, unsubstituted or substituted phenyl, alkoxy, phenoxy, a 5-membered or 6-membered heteroaromatic radical or $-COOH$), $-NHSO_2R^9$ (where $R^9$ is alkyl or phenyl) or $-N=N-R^{10}$ (where $R^{10}$ is the radical of a coupling component) and n is an integer from 1 to 6 and, where $R^6$ and/or $R^7$ is $-N=N-R^{10}$, may furthermore be 0.

In the general formula (XIX), $R^6$ and $R^7$ are each preferably $-NHCOR^8$, where $R^8$ is alkyl or unsubstituted or substituted phenyl, $-N=N-R^{10}$, where $R^{10}$ is the radical of a water-soluble coupling component, or in particular $-NO_2$ or $-NH_2$, and n is an integer from 1 to 3 and, where one or more of the radicals $R^6$ or $R^7$ is $-N=N-R^{10}$, may furthermore be 0. Dyes of the general formula (XIX) are described in, for example, DE-A-24 05 855, DE-A-30 07 077 and EP-A-0-13 750, or can be prepared by the methods stated there. These include, in particular, the dyes which can be prepared in a conventional manner by autocondensation of 5-nitro-o-toluenesulfonic acid, and C.I. Direct Yellow 11 (C.I. 40,000). These further migration-resistant dyes may be present in the photosensitive recording elements as a direct mixture with the dyes of the general formula (I) to be used according to the invention, i.e. together with these in the same layer or stratum of the photosensitive recording element, or may be present separately from these in a different layer or stratum, preferably also in graduated concentrations, as described above.

The novel photosensitive recording elements may furthermore contain, on the outer surface of the photosensitive recording layer, i.e. that surface which faces away from the dimensionally stable base, a top layer, which is preferably soluble in the same developer as the photosensitive recording layer, and/or a cover sheet which can be peeled off from the photosensitive recording layer or from any top layer present. Such top layers and cover sheets serve in particular to protect the photosensitive recording layer during storage and handling of the photosensitive recording elements and, if necessary, as an oxygen barrier, particularly when the photosensitive recording layer consists of a photopolymerizable mixture. Examples of top layers or cover sheets which have proven particularly useful are those consisting of polyvinyl alcohols or polyvinyl alcohol derivatives, polyolefins, polyesters or the like.

The novel photosensitive recording elements can be produced in a conventional manner. For example, a homogeneous mixture of the components forming the photosensitive recording layer can be prepared and applied in the form of a layer onto the dimensionally stable base, which may or may not be provided with one or more intermediate layers. The components of the said layer can be mixed in a suitable mixing apparatus, for example a mixer or extruder, or in solution in a suitable solvent or solvent mixture. The dimensionally stable base, with or without the intermediate layer or layers, can be coated with the photosensitive recording material by, for example, lamination with a preprepared layer of the photosensitive recording material or from solution by casting, immersion, spraying or another known method of application, followed by evaporation of the solvent. In the case of multi-stratum photosensitive recording layers, the individual strata can either be arranged one on top of the other by successive application from solution or can be preprepared and then bonded to one another in the desired sequence, for example by lamination. In the case of photosensitive recording elements which contain one or more intermediate layers between the base and the photosensitive recording layer, these intermediate layers can likewise be applied to the base in a conventional manner, for example by application from solution or lamination. In the case of photocurable intermediate layers, curing and crosslinking of the said layer can be effected after application of the photosensitive recording layer; in this case, however, the intermediate layer is preferably first cured and the photosensitive recording layer then applied to the previously cured, photocrosslinked intermediate layer. The dyes of the general formula (I) which are contained according to the invention in the photosensitive recording elements are incorporated, during the preparation, in the desired concentrations in the materials for the individual layers or, in the case of multi-stratum photosensitive recording layers, for the individual strata of the recording layer. A photosensitive recording element having a concentration gradient of the dye of the general formula (I) in a single-stratum photosensitive recording layer can be produced, for example, by a method in which the said dye is allowed to diffuse, if necessary at elevated temperatures, from a solution applied on one side into the photosensitive recording layer freshly cast from solution and still having a high solvent content. It is also possible to use a multi-layer casting apparatus, by means of which two or more photosensitive layers of different dye concentrations but the same composition can be cast in one operation, to produce a concentration gradient of the dye by diffusion, before the solvent has been removed in the subsequent drying process. This operation can be supported by deliberate partial mixing of adjacent layers in the boundary zones. The latter procedure is of course also possible in the coextrusion of two or more layers having different dye concentrations. Any top layer and/or cover sheet present can be applied subsequently to the photosensitive recording layer; however, it is also possible first to prepare the photosensitive recording layer on the cover sheet or top layer, for example by application from solution, and then to bond the resulting preprepared composite of top layer or cover sheet and photosensitive recording layer to the base, which may have been provided beforehand with the intermediate layer or layers.

The novel photosensitive recording elements are useful, for example, for the production of imagewise-structured resist layers and resist images and in particular for the production of printing plates and relief plates. The said recording elements can be converted to printing plates in a conventional manner by a method in which they are preexposed if necessary, exposed imagewise to actinic light through a suitable image-bearing transparency and then developed, for example by washing out with a suitable developer. The printing plates, relief plates or resist images thus produced can then be subjected to an aftertreatment, including, in particular, drying and/or nonimagewise postexposure. Suitable light sources for preexposure, imagewise exposure and postexposure are the conventional light sources which emit actinic radiation, in particular in the wavelength range from about 300 to 400 nm, such as UV fluorescence tubes, high pressure, medium pressure or low pressure mercury lamps, superactinic fluorescent tubes, pulsed xenon lamps, UV lasers and the like. The novel photosensitive recording elements are distinguished by their good and advantageous photochemical properties, which are not changed or adversely affected even on prolonged storage. Using the said recording elements, image-bearing originals can be reproduced exactly and faithfully to the original, and the exposure properties and structures of the resulting reliefs can be adjusted simply and in the desired manner. Because of the fluorescence properties of the dyes of the general formula (I) to be used according to the invention, the photosensitive recording elements containing these dyes are useful in particular for the production of printing plates and relief plates having specific relief structures.

The Examples which follow illustrate the invention. Parts and percentages are by weight, unless stated otherwise.

EXAMPLES 1 to 6 and COMPARATIVE EXPERIMENTS A AND B

Mixtures of 98.5% of a partially hydrolyzed polyvinyl acetate (degree of hydrolysis 82 mol %, molecular weight about 25,000) and 1.5% of the particular dye stated in the Table below were applied from solution in the form of a layer onto aluminum sheets in such a way that, after drying at from 100° to 150° C., a 10 μm thick antihalation layer resulted.

To produce a photopolymerizable, photosensitive recording layer, a solution of 48 parts of butane-1,4-diol dimethacrylate, 3.8 parts of 2,4,6-trimethylbenzoyldiphenylphosphine oxide and 1.0 part of 2,6-di-tert-butyl-p-cresol in 281 parts of 2-hydroxyethyl methacrylate was added to a solution of 222 parts of a partially hydrolyzed polyvinyl acetate (degree of hydrolysis 83 mol %, $\bar{M}_w$ about 30,000) and 95 parts of a partially hydrolyzed polyvinyl acetate which contained 22% of bound polyoxyethylene segments ($\bar{M}_w$: 25,000 to 30,000) in 318 parts of water. The solution thus obtained was filtered and degassed and then cast to give a photosensitive, photopolymerizable layer which, after drying, was about 500 μm thick.

The photosensitive, photopolymerizable layer thus produced was laminated with the antihalation layers present on the aluminum sheets under a pressure of 1N/cm². The resulting photosensitive recording elements were stored at room temperature, diffusion of the various dyes into the photosensitive, photopolymerizable layers being assessed visually after storage for 7 and 250 days. The results are also shown in the Table. As can be seen from the Table, little or no migration was detectable in the case of the dyes used according to the invention, whereas other sulfo-containing dyes, as recommended in the prior art for photosensitive recording elements, exhibited pronounced migration into the photopolymerizable, photosensitive recording layer after storage for only a short time.

TABLE

| Example/ Comparative Experiment | Dye | Migration into the photopolymerizable recording layer after | |
|---|---|---|---|
| | | 7 days | 250 days |
| 1 | Compound of the formula (II) | Extremely little | Extremely little |
| 2 | Compound of the formula (III) | None | None |
| 3 | Compound of the formula (IV) | Virtually none | Virtually none |
| 4 | Compound of the formula (IV) | Extremely little | Extremely little |
| 5 | Compound of the formula (XII) | Virtually none | Virtually none |
| 6 | Compound of the formula (XVII) | Virtually none | Virtually none |
| A | C.I. Acid Black 1 (C.I. 20,470) | Very pronounced | |
| B | C.I. Acid Violet 19 (C.I. 42,685) | Very pronounced | |

We claim:

1. A photosensitive recording element for the production of printing plates, relief plates or resist images, which consists essentially of
   (a) a dimensionally stable base, and
   (b) a solid photopolymerizable or photodegradable recording layer on the base and developable with a liquid developer,
said photosensitive recording element containing in the recording layer (b) in concentrations graduating over the layer thickness, one or more light-absorbing, unreactive, migration resistant compounds of the formula (I)

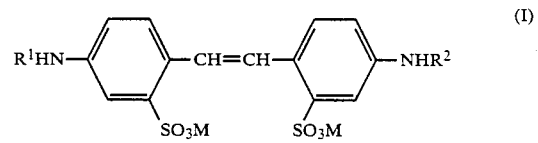

where M is a hydrogen atom or proton, an alkali metal cation, the ammonium cation or an amine cation and $R^1$ and $R^2$ are identical or different and are each a substituted s-triazine ring.

2. A photosensitive recording element as defined in claim 1, which has one or more intermediate layers (c) between the base and the recording layer in which the light-absorbing, unreactive compound is present in a concentration which differs from that in the photosensitive recording layer.

3. A photosensitive recording element as defined in claim 1, where in the concentration of the light-absorbing, unreactive compound decreases over the thickness of the recording element from the base toward the outer surface of the photosensitive recording layer.

4. A photosensitive recording element as defined in claim 2, wherein the light-absorbing, unreactive compound is present only in the recording layer (b).

* * * * *